United States Patent
Tada

(10) Patent No.: US 6,710,632 B2
(45) Date of Patent: Mar. 23, 2004

(54) DRIVE CIRCUIT

(75) Inventor: Tetsuya Tada, Hiji Hayami (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/314,833

(22) Filed: Dec. 9, 2002

(65) Prior Publication Data

US 2003/0122594 A1 Jul. 3, 2003

(30) Foreign Application Priority Data

Dec. 26, 2001 (JP) ........................................ 2001-393654

(51) Int. Cl.[7] ................................................. H03B 1/00
(52) U.S. Cl. ........................ 327/108; 327/333; 327/332; 327/323
(58) Field of Search .......................... 327/108–112, 309, 327/318, 321, 324, 312, 313, 314, 316, 327, 328, 331–333, 427, 374, 376, 377; 326/81, 83

(56) References Cited

U.S. PATENT DOCUMENTS

| | | | | |
|---|---|---|---|---|
| 5,204,562 A | * | 4/1993 | Pace | 327/108 |
| 6,294,941 B1 | * | 9/2001 | Yokosawa | 327/309 |
| 6,407,594 B1 | * | 6/2002 | Milazzo et al. | 327/112 |

* cited by examiner

*Primary Examiner*—Long Nguyen
(74) *Attorney, Agent, or Firm*—W. Daniel Swayze, Jr.; W. James Brady; Frederick J. Telecky, Jr.

(57) ABSTRACT

A drive circuit including circuitry that can be easily adjusted, the output drive current can be kept balanced, and high-precision drive current can be supplied to the load circuit. Clamp circuit 10 is furnished to hold the drain voltage of current output transistor QN12, which supplies drive current to a load resistor. When transistor QN12 is in a conducting state, drain voltage $V_A$ of transistor QN12 is held at approximately the same level as source voltage $V_D$ of transistor QN14 by clamp circuit 10. So rise and fall in the drain output current of transistor QN12 can be kept balanced, and rise and fall delay time can be made approximately equal for input signal $S_{in}$.

5 Claims, 3 Drawing Sheets

DRIVE CIRCUIT

FIELD OF THE INVENTION

The present invention pertains to a drive circuit that controls drive current supplied to a load by using a clamp circuit.

BACKGROUND OF THE INVENTION

In drive circuits that supply drive current for converting electrical energy into thermal energy, depending on the application, drive current that has an accurate output pulsewidth relative to the pulsewidth of the input control signals is required. For example, a design in which ink that is instantly heated to a high temperature and sprayed by a nozzle is used in a so-called inkjet printer to apply ink to printing paper. As the printed dots become finer, higher precision is required to control the timing for spraying the ink. For this reason, in drive circuits for heating ink, high-precision pulse signals must be output for the input pulse control signals.

For such a drive circuit, in addition to circuits that use existing bipolar transistors, drain output type drive circuits that use a high breakdown voltage NMOS have been proposed.

FIG. 5 is a circuit diagram showing one example of such a drive circuit. This drive circuit is constituted with PMOS transistors QP1 and QP2, NMOS transistors QN1, QN2 and QN3, and inverter INV1, as shown.

Transistor QN3 is a high-breakdown voltage NMOS transistor. The resistive element R1 connected to the drain of transistor QN3 is a load resistor. During operation, heat is generated by drive current $I_L$ that is output from the drain of transistor QN3 flowing through load resistor R1. This heat is used to heat the ink, for example.

As shown in FIG. 5, in PMOS transistors QP1 and QP2, the sources are connected to source voltage $V_{CC1}$ and the gates are connected to the drains of each other's transistors. The drains of NMOS transistors QN1 and QN2 are connected to the drains of transistors QP1 and QP2, respectively, and their sources are grounded. Input signal $S_{in}$ is applied to the gate of transistor QN1 and the inverted logic signal of input signal $S_{in}$ is applied to the gate of transistor QN2.

Load resistor R1 is connected between source voltage $V_{CC2}$ and the drain of NMOS transistor QN3. The gate of transistor QN3 is connected to the drain of transistor QN2 and its source is grounded.

Source voltage $V_{CC1}$ is 15 V, for example, and source voltage $V_{CC2}$ is 20–30 V, for example. For the logic level of input signal $S_{in}$, for example, the high level is 5 V and the low level is 0 V.

Input signal $S_{in}$, is a pulse signal, and transistor QN3 supplies a pulsed current signal to load resistor R1 corresponding to this pulse signal. The operation of this drive circuit is explained below with reference to FIG. 5.

When input signal $S_{in}$ is low, transistor QN1 is cut off and transistor QN2 is conducting. At this time, the drain of transistor QN2 is held approximately at ground potential, so that transistor QP1 conducts and transistor QP2 cuts off. At this time, node ND1 is held approximately at ground potential GND.

The voltage $V_{O1}$ of node ND1 is applied to the gate of transistor QN3, so that transistor QN3 cuts off and no current flows to load resistor R1.

Next, when input signal $S_{in}$ goes from low to high, transistor QN1 conducts and transistor QN2 cuts off. Accordingly, transistor QP2 conducts, so that transistor QP1 cuts off and node ND1 is held approximately at source voltage $V_{CC1}$. At this time, transistor QN3 conducts and drive current $I_L$ flows to load resistor R1. The drive current produces heat in load resistor R1.

As stated above, when input signal $S_{in}$ is low, transistor QN3 cuts off and no drive current is supplied to load resistor R1. On the other hand, when input signal $S_{in}$ is high, transistor QN3 conducts and drive current $I_L$ is supplied to load resistor R1. That is, the timing at which drive current is supplied to load resistor R1 is controlled according to input signal $S_{in}$.

In this connection, there is a large punch-through current that accompanies the switching of input signal Sin in the conventional drive circuit, and the amount of power consumed by the circuit will be high. In order to balance the output, that is, to equalize the rise time $t_r$ and fall time $t_f$ and the rise delay time $t_{PLH}$ and fall delay time $t_{PHL}$ of drive current $I_L$ supplied to the load resistor, the size of output transistors QP2 and QN2 and the magnitude of source voltage $V_{CC1}$ must be adjusted. In addition, they must be readjusted according to load conditions, such as the magnitude of source voltage $V_{CC2}$, the resistance of load resistor R1, etc. Even if they are adjusted, production variations must be taken into account.

The drive circuit shown in FIGS. 6 and 7 has been proposed to improve this situation.

As shown in FIG. 6, in this drive circuit, constant current sources IS1 and IS2 are added to the drive circuit shown in FIG. 5. As shown in the figure, the sources of PMOS transistors QP3 and QP4 are connected to each other and to current source IS1. The supply current $I_0$ from current source IS1 is input to the sources of transistor QP3 or QP4.

At the same time, current source IS2 is connected between the source and ground potential GND of transistor QN5. Thus, when transistor QN5 is conducting, its source current is determined by supply current $I_1$ from current source IS2.

The drive circuit shown in FIG. 6 operates in approximately the same way as the drive circuit shown in FIG. 5. That is, when input signal $S_{in}$ is low, transistor QN6 cuts off and no drive current is supplied to load resistor R2. On the other hand, when input signal $S_{in}$ is high, transistor QN6 conducts and drive current $I_L$ is supplied to load resistor R2. The timing of the drive current supplied to load resistor R2 is controlled according to input signal $S_{in}$ in this way.

FIG. 7 shows an example of another improvement to a drive circuit. As shown in the figure, transistors QP5 and QP6 constitute a current mirror circuit in this drive circuit. The current mirror circuit functions as a timing load circuit for transistors QN7 and QN8. Resistive element R3 is connected between the drain of transistor QP5 and the drain of QN7, and resistive element R4 is connected between the drain of transistor QP6 and the drain of QN8.

This drive circuit also operates in approximately the same way as the drive circuit shown in FIG. 5. That is, when input signal $S_{in}$ is low, transistor QN9 cuts off and no drive current is supplied to load resistor R5. On the other hand, when input signal $S_{in}$ is high, transistor QN9 conducts and drive current $I_L$ is supplied to load resistor R5. The timing of the drive current supplied to load resistor R5 is controlled according to input signal $S_{in}$ in this way.

In the drive circuit shown in FIG. 6, punch-through current during switching is limited by current sources IS1 and IS2. However, with this drive circuit, source voltage $V_{CC1}$ and output currents $I_0$ and $I_1$ of current sources IS1 and IS2 must be adjusted to balance the output, and they must also be readjusted according to load conditions, for example, the value of source voltage $V_{CC2}$, the resistance of load resistor R2, etc.

And in the drive circuit shown in FIG. 7, punch-through current during switching is limited by resistive elements R3 and R4 that are connected to the drains of transistor QN7 and QN8. However, like the drive circuits shown in FIGS. 5 and 6, the values for resistive elements R3 and R4 and source voltage $V_{CC1}$ must be adjusted, and in addition, readjusted, according to load conditions, for example, the value of source voltage $V_{CC2}$, the resistance of load resistor R5, etc., in order to balance output.

SUMMARY OF THE INVENTION

The present invention was devised in consideration of these circumstances. Its purpose is to provide a drive circuit that makes circuit adjustment easy, that can maintain a balanced output drive current, and that can supply high precision drive current to the load circuit.

In order to solve the problems, the drive circuit of the present invention supplies drive current to a load resistor that is connected to a first source voltage supply element. It has a current output MOS transistor that is connected in series with the load resistor, a drive part that is connected to a second source voltage supply terminal and that supplies drive current to the gate terminal of the current output MOS transistor, and a clamp circuit that is connected to the second source voltage supply terminal to hold the drain terminal of the current output MOS transistor at a prescribed voltage.

Also, in the present invention, ideally, the clamp circuit comprises a first MOS transistor that is connected between the gate terminal and the drain terminal of the current output MOS transistor, a second MOS transistor whose gate terminal and drain terminal are connected to each other and in which said gate terminal is connected to the gate terminal of the first MOS transistor, a rectifying element that is connected between the gate terminal of the current output MOS transistor and the first MOS transistor or between the first MOS transistor and the drain terminal of the current output MOS transistor, and a current hold means that is connected to the source terminal of the second MOS transistor and that holds the potential of said source terminal at a prescribed voltage.

Also, in the present invention, ideally, the clamp circuit comprises a first current source that supplies current to the second MOS transistor, and the current output MOS transistor and the first and second MOS transistors are NMOS transistors. The voltage hold means is preferably a plurality of diodes that are connected in series between the source terminal and reference potential of the second NMOS transistor.

In addition, the first current source preferably has a first PMOS transistor that is connected between the second source voltage supply terminal and the drain terminal of the second NMOS transistor, a second PMOS whose gate terminal and drain terminal are connected to each other, in which said gate terminal is connected to the gate terminal of the first PMOS transistor and whose source terminal is connected to the second source voltage supply terminal, and a first resistor connected between the drain terminal and the reference potential of the second PMOS transistor.

Also, in the present invention, ideally, the rectifying element is a diode whose anode is connected to the gate terminal of the current output NMOS transistor and whose cathode is connected to the drain terminal of the first NMOS transistor, or a third NMOS transistor connected between the drain terminal of the current output NMOS transistor and the source terminal of the first NMOS transistor and whose gate terminal is connected to the drain terminal of the first NMOS transistor.

Also, in the present invention, ideally, the drive part has a fourth MOS transistor that is connected to the gate terminal of the current output MOS transistor and that supplies a drive signal to the current supply MOS transistor, and a second current source that supplies current to the fourth MOS transistor.

Also in the present invention, ideally, the drive part has a third current source that is connected between the source terminal and the reference potential of the fourth MOS transistor, which is an NMOS transistor, and a fifth NMOS transistor that is connected between the second current source and the reference potential and that operates complementarily with the fourth NMOS transistor. The second current source is connected between the supply terminal of the second power supply voltage and the fifth NMOS transistor. The current source preferably has a third PMOS transistor whose gate terminal and drain terminal are connected, and a fourth PMOS transistor that is connected between the second source voltage supply terminal and the middle point of the connection between gate terminal of the current output MOS transistor and the fourth NMOS transistor, and whose gate terminal is connected to the gate terminal of the third PMOS transistor.

In addition, the drive part preferably has a second resistive element that is connected between the drain terminal of the third PMOS transistor and the drain terminal of the fifth NMOS transistor, and a third resistive element that is connected between the second source voltage supply terminal and the gate terminal of the third PMOS transistor.

DETAILED DESCRIPTION

Figure 1:
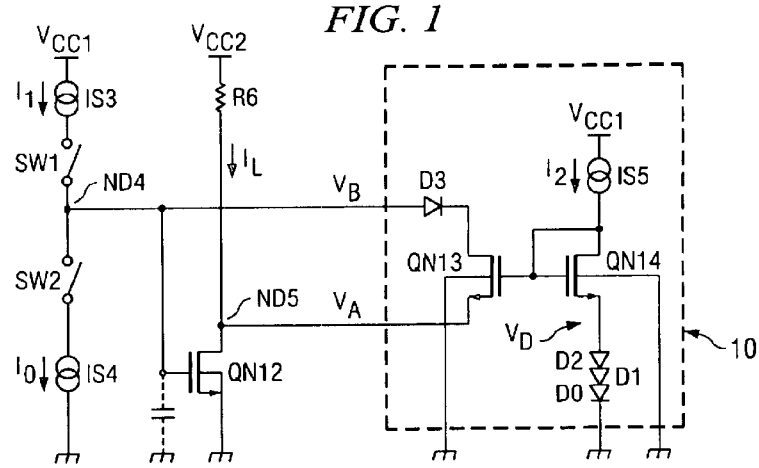
FIG. 1 is a schematic diagram that shows a first embodiment of a drive circuit associated with the present invention.

FIG. 1 is a schematic diagram that shows a first embodiment of a drive circuit associated with the present invention.

As shown in the figure, the drive circuit in this embodiment is formed with current sources IS3, IS4 and IS5, switching elements SW1 and SW2, NMOS transistor QN12, NMOS transistors QN13 and IN14, reverse-current blocking diode D3, and diodes D0, D1 and D2.

As shown in the figure, current source IS3 is connected to node ND4 by switching element SW1, and current source IS4 is connected to node ND4 by switching element SW2. The gate of transistor QN12 is connected to node ND4, its drain is connected to load resistor R6, and its source is grounded. Transistor QN12 is a current output transistor. That is, the timing of drive current $I_L$ supplied to load resistor R6 is controlled by whether transistor QN12 is on or off.

Switching elements SW1 and SW2 are controlled by control signals (not shown) input from the outside.

Clamp circuit 10 is comprised of transistors QN13 and QN14, reverse-current blocking diode D3, diodes D0, D1 and D2, and current source IS5 in the drive circuit shown in FIG. 1. As shown in the figure, the drain of transistor QN13 is connected to the cathode of diode D3 and its source is connected to the drain of transistor QN12, that is, to node ND5. The anode of diode D3 is connected to node ND4. The gates of transistors QN13 and QN14 are connected together, and to the drain of transistor QN14. Current source IS5 is connected to the drain side of transistor QN14 and diodes D2, D1 and D0 are connected in series with its source side.

Output currents $I_1$ and $I_0$ from constant current sources IS3 and IS4 are set to be equal in the above-mentioned drive circuit. Thus, balance can be maintained in load current $I_L$ coordinated with the operation of clamp circuit 10 without variation in load conditions, for example, source voltage $V_{CC2}$ supplied to the load resistor, the resistance value of load resistor R6, etc.

The operating principle of the drive circuit in this embodiment is explained below with reference to FIG. 1.

First, when switching element SW1 is turned on and switching element SW2 is turned off corresponding to the control signals, the gate parasitic capacitance of transistor QN12 is charged by supply current $I_1$ from current source IS3 and the gate voltage of transistor QN12 rises. That is, the voltage $V_B$ at node ND4 rises. When voltage $V_B$ at node ND4 exceeds the threshold voltage $V_{THN}$ of transistor QN12, transistor QN12 conducts and drive current $I_L$ is supplied to load resistor R6. At this time, the drain voltage of transistor QN12, that is, voltage $V_A$ at node ND5 is kept approximately at a fixed value by clamp circuit 10.

If it is assumed that the sizes of transistors Q13 and QN14 are equal and that current $I_2$ from current source IS5 and current $I_1$ from current source IS3 are equal in clamp circuit 10, and that the forward voltage drops of diodes D2, D1 and D0 are all $V_{th}$, then source voltage $V_D$ of transistor QN14 during operation will be held at 3Vth. The source voltage of transistor QN13, that is, the voltage at node ND5, is clamped by the source voltage $V_D$ of transistor QN14. This is explained in concrete terms below.

When transistor QN12 conducts, if the voltage at node ND5 drops below source voltage $V_D$ of transistor QN14, transistor QN13 conducts and the voltage $V_A$ at node ND5 is raised. When the voltage at node ND5 goes above $V_D$ and voltage $V_A$ at node ND5 is reduced by transistor QN12, transistor QN13 cuts off due to the operation of reverse-current blocking diode D3.

In this way, the voltage at node ND5 is held approximately at the source voltage $V_D$ of transistor QN14 when transistor QN12 is conducting by clamp circuit 10 that is constituted by transistors QN13 and QN14, reverse-current blocking diode D3, and series connected diodes D2, D1 and D0. In the example shown in FIG. 1, source voltage $V_D$ of transistor QN14 is determined by the forward voltage drops of three series connected diodes, but where the number of diode may be set as deemed as necessary.

When switching element SW1 is turned off and switching element SW2 is turned on corresponding to the control signals, node ND4 is held approximately at ground potential. Thus, transistor QN12 cuts off and node ND5 is held approximately at source voltage $V_{CC2}$. At this time, no drive current flows to load resistor R6.

In this way, in the drive circuit shown in FIG. 1, switching elements SW1 and SW2 alternately turn on and off according to the input signals, and transistor QN12 conducts or cuts off accordingly. When transistor QN12 is on, drive current $I_L$ is supplied to load resistor R6. Also at this time, drain voltage $V_A$ of transistor QN12 is held approximately at the source voltage $V_D$ of transistor QN14 by clamp circuit 10. On the other hand, when transistor QN12 is off, no current is supplied to load resistor R6. Also at this time, transistor QN13 is also held off.

In the drive circuit in this embodiment, the drain voltage of drive transistor QN12 can be held at a prescribed level by clamp circuit 10 during operation, and transistor QN12 can be prevented from becoming saturated. The pulse width of drive current $I_L$ supplied to load resistor R6 can be made approximately equal to the pulse width of the control signals that are input by setting supply currents $I_1$ and $I_0$ from current sources IS3 and IS4 approximately equal, and the output can be balanced. Voltage $V_B$ at node ND4 is also held at an intermediate level between source voltage $V_{CC1}$ and the source voltage $V_D$ of transistor QN14 when drive transistor QN12 is conducting, so that it is a simple matter to balance the rise/fall times so that the delay times of the gate voltage of drive transistor QN12 can be equalized.

Figure 2:
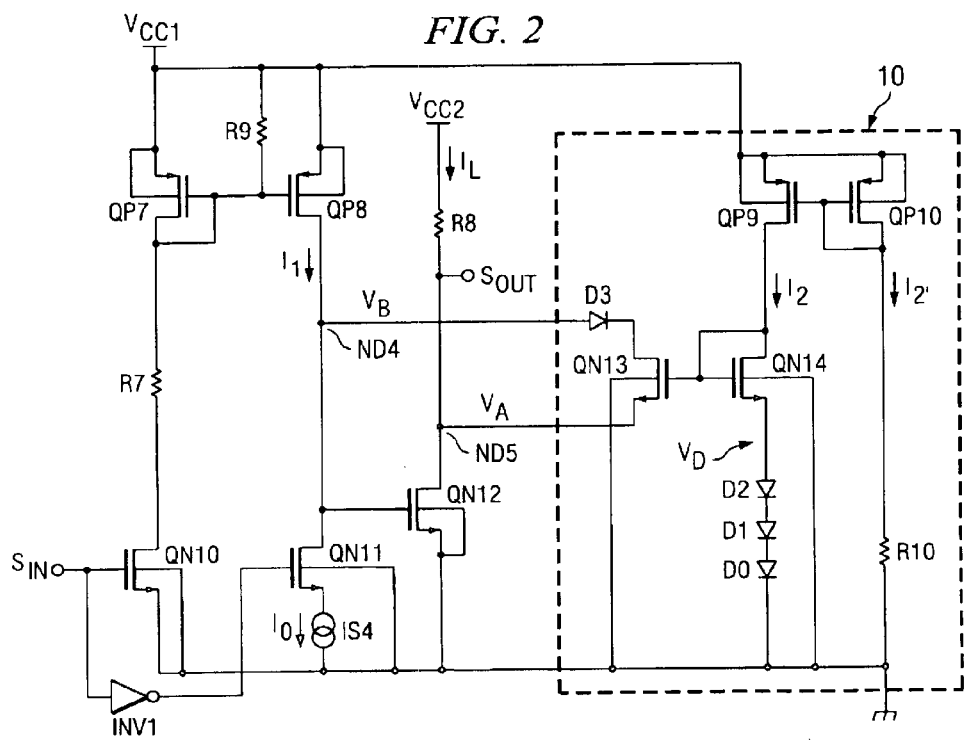
FIG. 2 is a circuit diagram that shows an example of a first embodiment of a drive circuit associated with the present invention.

FIG. 2 is a circuit diagram that shows an example of the diagram circuit in this embodiment. As shown in the figure, this example of a drive circuit is formed by PMOS transistors QP7, QP8, QP9 and QP10, NMOS transistors QN10, QN11, QN12, QN13 and QN14, current source IS4, inverter INV1, resistive elements R7, R8, R9 and R10, reverse-current blocking diode D3, and diodes D2, D1 and D0.

As shown in FIG. 2, the sources of transistors QP7 and QP8 are both connected to source voltage $V_{CC1}$, their gates are connected together and to the drain of transistor QP7. Resistive element R9 is also connected between the node connecting the gates of transistors QP7 and QP8 and source voltage $V_{CC1}$.

The source of transistor QN10 is grounded, and its drain is connected to the drain of transistor QP7 through resistive element R7. The source of transistor QN11 is grounded through current source IS4 and its drain is connected to the drain of transistor QP8. Input signal $S_{in}$ is applied to the gate of transistor QN10 and the inverted logic signal of input signal $S_{in}$ is applied to the gate of transistor QN11.

The source of current output transistor QN12 is grounded and its drain is connected to load resistor R8. The other terminal of load resistor R8 is connected to source voltage $V_{CC2}$. The gate of transistor QN12 is connected to the drain of transistor QN11.

Clamp circuit 10 includes transistors QN13 and QN14, reverse-current blocking diode D3, diodes D2, D1 and D0, transistors QP9 and QP10, and resistive element R10. As shown in FIG. 2, the source of transistor QN13 is connected to the drain of transistor QN12, that is, to node ND5, and its drain is connected to the cathode of reverse-current blocking diode D3. The anode of reverse-current blocking diode D3 is connected to the drain of transistor QN11, that is, to node ND4. The source of transistor QN14 is grounded through series connected diodes D2, D1 and D0, and its drain is connected to the drain of transistor QP9. The gates of transistors QN13 and QN14 are connected together and to the drain of transistor QN14.

The sources of transistors QP9 and QP10 are connected to source voltage $V_{CC1}$, their gates are connected together and to the drain of transistor QP10. The drain of transistor QP10 is grounded through resistor R10.

A current mirror circuit includes transistors QP9 and QP10 in clamp circuit 10 as described above. Thus, the drain current $I_2$ of transistor QP9 is determined by the drain current $I'_2$ of transistor QP10. Note that the drain current of transistor QP10 is determined by source current $V_{CC1}$ and the value of resistor R10. Thus, constant current $I_2$ is supplied to the drain of transistor QN14 by the current mirror circuit.

During operation, source voltage $V_D$ of transistor QN14 is determined by the forward voltage drop in diodes D2, D1 and D0. That is, letting the forward voltage drops of diodes D2, D1 and D0 all be $V_{th}$, as in above-mentioned FIG. 1, source voltage $V_D$ of transistor QN14 will be 3 $V_{th}$.

In the drive circuit in this embodiment, when transistor QN12 is conducting, the drain voltage of transistor QN12, that is, the source voltage $V_A$ of transistor QN13, is clamped by the source voltage $V_D$ of transistor QN14 by the operation of clamp circuit 10.

This is explained in more detail below.

When input signal $S_{in}$ is high, transistor QN10 is conducting and transistor QN11 is cut off. At this time, the drain voltage of transistor QN11, that is, the potential at node ND4, rises so that transistor QN12 conducts, and drive current $I_L$ is supplied to load resistor R8. At this time, voltage $V_B$ at node ND4 is held at an intermediate voltage, which is equal to the forward voltage drop $V_{F(D3)}$ of diode D3 plus source voltage $V_{CC1}$ and source voltage $V_D$ of transistor QN14, according to the current value of drive current $I_L V_{CC1} > V_B > V_{F(D3)}$.

At this time, when the drain voltage of transistor QN12, that is, the voltage $V_A$ at node ND5, goes lower than source voltage $V_D$ of transistor QN14, transistor QN13 conducts and the drain voltage $V_A$ of transistor QN12 is raised. Conversely, when the drain voltage VA of transistor QN12 is higher than source voltage $V_D$ of transistor QN14, transistor QN13 cuts off due to the operation of reverse-current blocking diode D3 and the drain voltage $V_A$ of transistor QN12 is lowered by transistor QN12. Thus, when transistor QN12 is conducting, its drain voltage, that is, voltage $V_A$ at node ND5, is always held at a level approximately equal to source voltage $V_D$ of transistor QN14 of clamp circuit 10.

That is, when transistor QN12 is conducting, its drain voltage $V_A$ is clamped at the same level as source voltage $V_D$ of transistor QN14 by clamp circuit 10, which is constituted by transistors QN13 and QN14, reverse-current blocking diode D3, and diodes D2, D1 and D0. Thus, transistor QN12 can be kept from dropping into a deeply saturated state, that is, gate voltage $V_B$ of transistor QN12 can be prevented from rising more than necessary during operation, transistor QN12 can be switched on and off at high speed, and the rise and fall of drive current $I_L$ output to load resistor R8 can be kept balanced. The delay time in the rise and fall of drive current $I_L$ output to load resistor R8 can also be kept approximately equal for input signal $S_{in}$, and the timing of the drive current can be controlled with high precision by input signal $S_{in}$.

Figure 3:
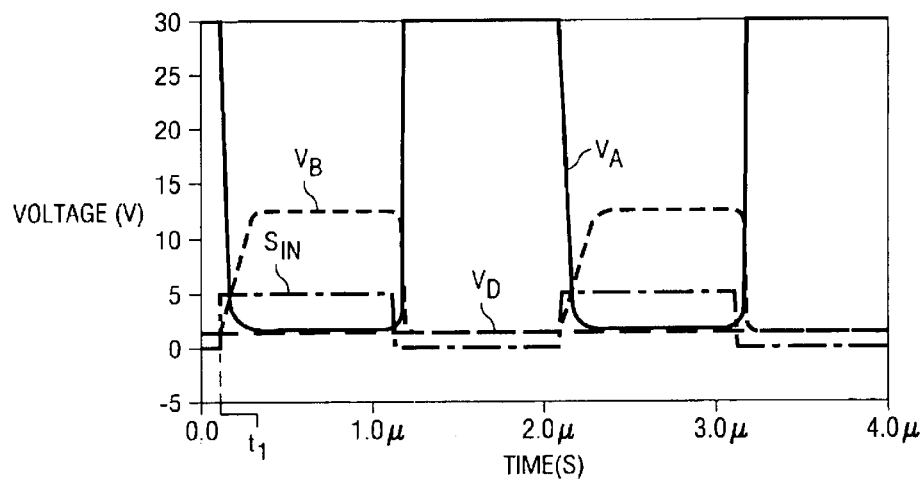
FIG. 3 is a waveform diagram that shows the operation of a first embodiment of a drive circuit associated with the present invention.

FIG. 3 is a waveform diagram that shows signal waveforms when the drive circuit shown in FIG. 2 is operating. The operation of the drive circuit in this embodiment is explained below with reference to FIGS. 2 and 3.

Here it is assumed that source voltage $V_{CC1}$ is 15–30 V and that source voltage $V_{CC2}$ is 20–30 V. Input signal $S_{in}$ is a pulse signal with a cycle of 2.0 μs. Source voltages $V_{CC1}$ and $V_{CC2}$ may be the same or different voltages.

First, when input signal $S_{in}$ is low, transistor QN10 cuts off and transistor QN11 conducts. That is, at this time, the gate of transistor QN12 is held approximately at ground potential, so that transistor QN12 cuts off. At this time, no drive current is output to load resistor R8.

Next, as shown in FIG. 3, input signal $S_{in}$ changes from low to high at time $t_1$. Thus, transistor QN10 conducts and transistor QN11 cuts off, and the drain voltage $V_B$ of transistor QN11 goes from low to high, and transistor QN12 thereby switches to a conductive state.

At this time, the drain voltage $V_A$ of transistor QN12, that is, the voltage at node ND5 is held at approximately the same level as source voltage $V_D$ of transistor QN14 by clamp circuit 10. That is, $V_A=3V_{th}$. Drive current $I_L$ is also supplied to load resistor R8.

As explained above, with the drive circuit in this embodiment, a clamp circuit 10 is furnished for a drain output type drive circuit and the drain voltage of the current output transistor is held at a prescribed level. The timing of drive current $I_L$ that is supplied to load resistor R8 is controlled according to input signal $S_{in}$ in the drive portion. When current output transistor QN12 is in a conducting state, its drain voltage $V_A$ is held at a fixed voltage level by clamp circuit 10. Thus, transistor QN12 can be prevented from falling into a saturated state, that is, gate voltage $V_B$ of transistor QN12 can be prevented from rising more than is required, it can be switched on and off at high speed, and the rising and falling of drive current $I_L$ that is output to load resistor R8 can be kept balanced. The delay time of the rising and falling of drive current $I_L$ output to load resistor R8 can also be kept approximately equal for input signal $S_{in}$, and the timing of the drive current can be controlled with high precision by input signal $S_{in}$.

Also, as shown in FIG. 2, the drain current $I_1$ of transistor QP8 is determined by the current mirror circuit, which includes transistors QP7 and QP8, in the drive part of the drive circuit in this embodiment. The current flowing to transistor QN11 is determined by supply current $I_0$ from current source IS4. Thus, punch-through current when transistor QN11 is switched on and off is limited by current $I_1$ of the current mirror circuit and by current $I_0$ from the current source, and increased power consumption due to the transistor switching, malfunctions in the circuit due to switching noise, etc. can be prevented.

In addition, the circuits other than reverse-current blocking diode D3 and transistor QN13 in clamp circuit 10 furnished for the drive circuit in this embodiment can be shared by multiple output portion circuits. That is, in the drive circuit shown in FIG. 2, an output array circuit can be constituted by furnishing a plurality of reverse-current blocking diodes D3, transistors QN13 and drive circuits in clamp circuit 10. The multiple drive portions in this array circuit can share one clamp circuit to improve controllability. Thus, the circuit constitution will not become more complicated because of furnishing a clamp circuit, and it is possible to realize miniaturization of the print head used for inkjet printers and finer printed dots, for example.

Second Embodiment

Figure 4:
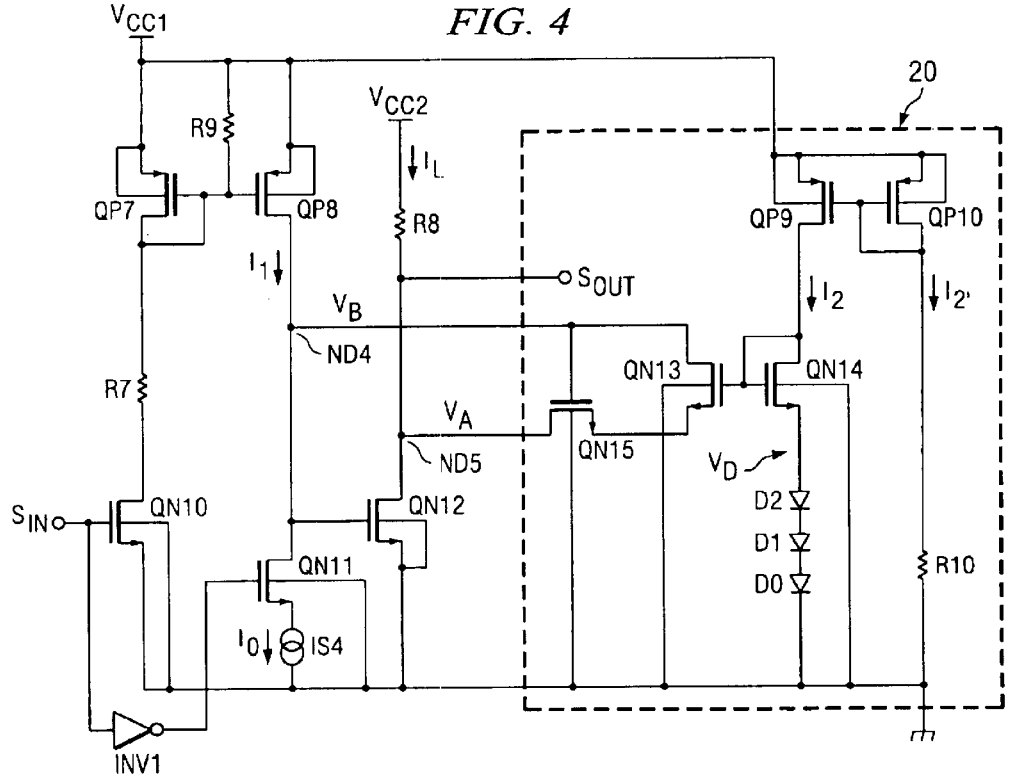
FIG. 4 is a circuit diagram that shows a second embodiment of a drive circuit associated with the present invention.
Figure 5:
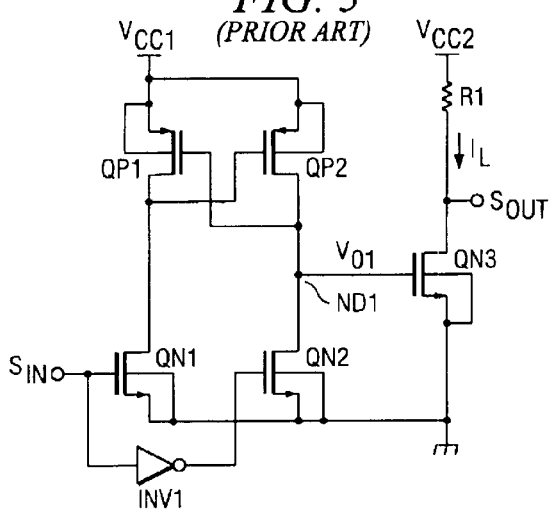
FIG. 5 is a circuit diagram that shows an example of a conventional drive circuit.
Figure 6:
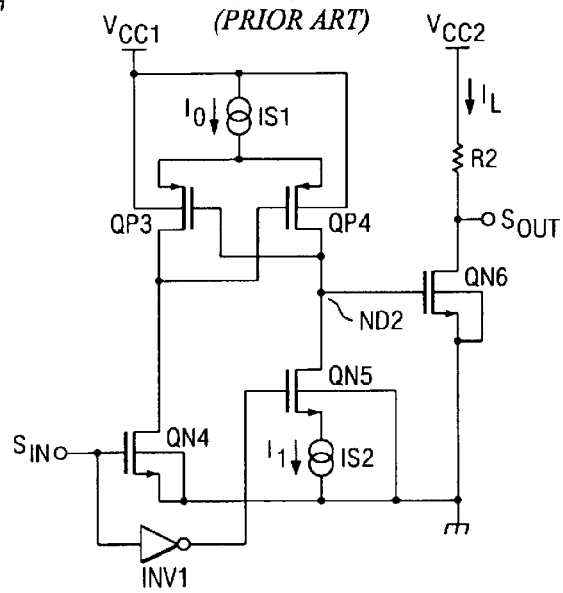
FIG. 6 is a circuit diagram that shows another example of a conventional drive circuit.
Figure 7:
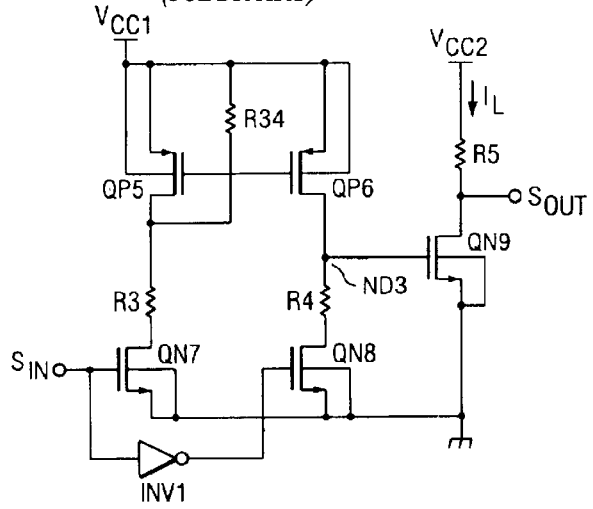
FIG. 7 is a circuit diagram that shows another example of a conventional drive circuit.

FIG. 4 is a circuit diagram that shows a second embodiment of a drive circuit associated with the present invention.

As shown in the figure, the drive circuit in this embodiment is similar to the drive circuit in the first embodiment of the present invention shown in FIG. 2. However, in this embodiment, clamp circuit 20 differs from clamp circuit 10 in the drive circuit in the first embodiment.

As shown in FIG. 4, in the drive circuit in this embodiment, the drive portion, including NMOS transistor QN10, QN11 and QN12, is similar to the portion corresponding to the drive circuit in the first embodiment shown in FIG. 2.

On the other hand, clamp circuit 20 is constituted by NMOS transistors QN13, QN14 and QN15, PMOS transistor QP9 and QP10, diodes D2, D1 and D0, and resistor R10. Compared to clamp circuit 10 in the drive circuit of the first embodiment, reverse-current blocking diode D3 has been omitted and NMOS transistor QN15 has been added.

In the first embodiment of the drive circuit of the present invention, when current output transistor QN12 is cut off, its drain voltage, that is, the voltage $V_A$ at node ND5, is held approximately at source voltage $V_{CC2}$. At this time, the gate voltage of transistor QN13 is equal to the gate voltage of transistor QN14, and will equal, for example, the sum of the forward voltage drops of series connected diodes D2, D1 and D0 and the voltage between the gate and source of transistor QN14. Source voltage $V_{CC2}$ is normally a high voltage of 20–30 V. Thus, a high reverse bias voltage is applied between the gate and source of transistor QN13, so that a transistor with the ability to withstand reverse voltage between the gate and source must be used for transistor QN13. For example, by using a symmetrical LDMOS with double diffusion applied to both the source and the drain for transistor QN13, reverse bias voltage between the gate and source can be withstood. But with an asymmetrical LDMOS where only the drain is doubly diffused, the breakdown voltage between the source and substrate is small and it will not withstand reverse bias voltage. In this way, measures must be taken to improve the reverse breakdown voltage characteristics between the source and substrate (back gate) of transistor QN13 in the drive circuit in the first embodiment of the present invention shown in FIG. 2. Thus, the number of manufacturing processes increases and manufacturing costs rise, which produces difficulties.

In contrast, in the clamp circuit of the drive circuit in this embodiment, NMOS transistor QN15 is connected between the drain of transistor QN12 and the source of transistor QN13. As shown in FIG. 4, the drain of transistor QN15 is connected to the drain of transistor QN12, that is, to node ND5, and its source is connected to the source of transistor QN13. The gate of transistor QN15 is connected to node ND4.

In a clamp circuit constituted in this way, node ND4 is held at low level in accordance with input signal $S_{in}$, and when transistor QN12 is cut off, transistor QN15 is also cut off. At this time, the voltage difference between source voltage $V_{CC2}$ applied to the drain of transistor QN15 and the substrate voltage of transistor QN13 is borne by transistor QN15 and transistor QN13. That is, this voltage difference is divided between the source and drain of transistor QN15 and between the source and substrate of transistor QN13. Transistor QN15 is cut off, so that there is a large resistance between its drain and source, and nearly all of that voltage difference is applied between the drain and source of transistor QN15. Thus, a high reverse bias voltage will not be applied between the source and substrate of transistor QN13, and transistor QN13 need not have regular breakdown voltage characteristics. The gate voltage of transistor QN15 will also go low (ground potential) by holding node ND4 low, so that transistor QN15 will be completely cut off. Thus, the reverse-current blocking diode D3 in the application example in FIG. 2 will be unnecessary.

Normally, the breakdown voltage is high between the drain and source in an asymmetrical LDMOS transistor where only the drain has a doubly diffused structure, and this high voltage can be withstood sufficiently without performing any special breakdown voltage processing. Thus, an increase in the number of manufacturing processes can be avoided and manufacturing costs can be kept to a minimum.

As described above, the drive circuit in this embodiment is approximately the same as the drive circuit in the first embodiment of the present invention shown in FIG. 2 except that reverse-current blocking diode D3 is omitted and transistor QN15 is added in clamp circuit 20. Thus, the drive circuit in this embodiment operates approximately in the same way as the drive circuit in the above-mentioned first embodiment. The operation of the drive circuit in this embodiment will be explained briefly below with reference to FIG. 4.

When input signal $S_{in}$ is low, transistor QN10 cuts off and transistor QN11 conducts. Node ND4 is held at a low level and thus transistor QN12 cuts off. At this time, node ND5 is held approximately at source voltage $V_{CC2}$, and no source current flows to load resistor R8. At this time, transistor QN15 cuts off, high voltage between node ND5 and the substrate of transistor QN13 or QN15 is nearly all applied between the drain and source of transistor QN15, and the breakdown voltage load between the source and substrate of transistor QN13 or transistor QN15 is reduced.

When input signal $S_{in}$ goes from low to high, transistor QN10 conducts and transistor QN11 cuts off. Thus, node ND4 is held at a high level, for example, an intermediate level between source voltage $V_{CC1}$ and source voltage $V_D$ of transistor QN14 corresponding to drive current $I_L$. Transistors QN12, QN13 and QN15 correspondingly conduct. At this time, the voltage $V_A$ at node ND5 is held approximately equal to source voltage $V_D$ of transistor QN14 by clamp circuit 20. For example, letting the forward voltage drop of each of the diodes D2, D1 and D0, which are series connected between the source and ground potential of transistor QN14, be $V_{th}$, source voltage $V_D$ of transistor QN14 will be $3V_{th}$. Voltage $V_A$ at node ND5 will thus be held at approximately $3V_{th}$.

When transistor QN12 conducts, drive current drive current $I_L$ flows to load resistor R8.

As described above, the timing of drive current $I_L$ supplied to load resistor R8 is controlled according to input signal $S_{in}$ in the drive circuit in this embodiment. That is, when input signal $S_{in}$ is low, no drive current is supplied to load resistor R8, and when Sin is high, drive current $I_L$ is supplied to load resistor R8. In addition, clamp circuit 20 is furnished in the drive circuit in this embodiment, and when current output transistor QN12 is conducting, its drain voltage is held at a prescribed level. Thus, it is possible to prevent transistor QN12 from becoming deeply saturated, that is, to prevent the gate voltage of transistor QN12 from rising more than required and it can be switched on and off at high speed. The symmetry of the rise and fall in the drive current output to the load resistor will also be good, and the delay times of the rising and falling flanks for input signal $S_{in}$ can be kept approximately equal.

Punch-through current when transistor QN11 in the drive part switches is limited by the output current $I_1$ of the current mirror circuit, includes transistors QP7 and QP8, and the supply current $I_0$ from current source IS4, like the drive circuit in the first embodiment. Thus, an increase in power consumption due to the switching of the transistor state can be controlled. Circuit malfunctions, etc. caused by transistor switching can also be prevented.

In addition, with the drive circuit in this embodiment, the circuits other than transistors QN13 and QN15 of the clamp circuit can be shared by multiple drive portions, as in the above-mentioned first embodiment of the present invention. Thus, if only one clamp circuit is furnished for an output array circuit constituted by multiple drive parts, the output characteristics of all the drive portions can be improved. Thus, for example, it is a simple matter to realize miniaturization of print heads and finer printed dots that have good precision.

As explained above, the advantage of the drive circuit of the present invention is that the rising and falling of the drive current supplied to the load resistor can be kept balanced, the rise delay time and fall delay time of the drive current supplied to the load resistor can be kept approximately equal, and the output timing of the drive current can be controlled with high precision.

Also in the present invention, a single clamp circuit can be shared by multiple drive portions. Thus, if only one clamp circuit is furnished for an output array circuit composed of multiple drive portions, the output characteristics of all the drive portions can be improved, the circuit constitution will not complicated by furnishing the clamp circuit, and miniaturization of print heads and finer printed dots can be more easily realized.

In addition, the present invention has the following advantages: by connecting a MOS transistor to the source side of a transistor for which the reverse breakdown voltage characteristics are required in the clamp circuit, malfunction produced by reverse breakdown voltage can be prevented even in a MOS transistor that has normal breakdown voltage characteristics, an increase in the number of circuit manufacturing processes can be avoided; and reduced manufacturing costs can be realized.

What is claimed is:

1. A drive circuit to supply drive current to a load resistor that is connected to a first power voltage supply terminal, comprising:

a current output MOS transistor connected in series with the load resistor, a drive part that is connected to a second power voltage supply terminal, and that supplies a drive signal to the gate terminal of the current output MOS transistor, and a clamp circuit that is connected to the second power voltage supply terminal to hold the drain terminal of the current output MOS transistor at a predetermined potential, wherein the clamp circuit comprises:

a first MOS transistor that is connected between the gate terminal and the drain terminal of the current output MOS transistor, a second MOS transistor in which the gate terminal and the drain terminal are connected together and in which said gate terminal is connected to the gate terminal of the first MOS transistor, a rectifying element that is connected between the gate terminal of the current output MOS transistor and the first MOS transistor, or between the first MOS transistor and the drain terminal of the current output MOS transistor, and a voltage holding circuit that is connected to the source terminal of the second MOS transistor and that holds the potential of said source terminal at a predetermined voltage.

2. The drive circuit of claim 1, wherein the clamp circuit has a first current source that supplies current to the second MOS transistor, the current output MOS transistor and the first and second MOS transistors are NMOS transistors, and the voltage holding circuit is a plurality of diodes connected in series between the source terminal and a reference potential.

3. The drive circuit of claim 2, wherein the first current source has a first PMOS transistor that is connected between the second power supply voltage terminal and the drain terminal of the second MOS transistor, a second PMOS transistor having a gate terminal and drain terminal being connected to each other, where said gate terminal is connected to the gate terminal of the first PMOS transistor, and having a source terminal being connected to the second power supply voltage terminal, and a first resistive element that is connected between the drain terminal and the reference potential.

4. The drive circuit of claim 2, wherein the rectifying element is a diode whose anode is connected to the gate terminal of the current output MOS transistor and whose cathode is connected to the drain terminal of the first MOS transistor.

5. The drive circuit of claim 2, wherein the rectifying element is a third NMOS transistor that is connected between the drain terminal of the current output MOS transistor and the source terminal of the first MOS transistor, and whose gate terminal is connected to the drain terminal of the first MOS transistor.

* * * * *